United States Patent
Kim et al.

(10) Patent No.: US 10,197,333 B2
(45) Date of Patent: Feb. 5, 2019

(54) METHOD AND APPARATUS FOR DRYING SUBSTRATE

(71) Applicant: Semes Co., Ltd., Cheonan-si, Chungcheongnam-do (KR)

(72) Inventors: Boong Kim, Cheonan-si (KR); Min Sung Han, Siheung-si (KR); Joo Jib Park, Asan-si (KR); Woo Young Kim, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 292 days.

(21) Appl. No.: 15/152,979

(22) Filed: May 12, 2016

(65) Prior Publication Data
US 2016/0334162 A1   Nov. 17, 2016

(30) Foreign Application Priority Data

May 15, 2015 (KR) ......................... 10-2015-0067845

(51) Int. Cl.
*F26B 21/14* (2006.01)
*F26B 9/06* (2006.01)
(Continued)

(52) U.S. Cl.
CPC .............. *F26B 21/145* (2013.01); *F26B 3/04* (2013.01); *F26B 9/06* (2013.01); *F26B 21/10* (2013.01);
(Continued)

(58) Field of Classification Search
CPC .. F26B 21/145; F26B 3/04; F26B 9/06; F26B 21/10; F26B 21/12; H01L 21/02101; H01L 21/67034; H01L 21/67051; H01L 21/67109; H01L 21/6709; H01L 21/67248; H01L 21/67253
(Continued)

(56) References Cited

U.S. PATENT DOCUMENTS 5,417,768 A * 5/1995 Smith, Jr. .......... B01D 11/0203
                                              134/10
6,960,242 B2 * 11/2005 Leitch .................... B01D 53/04
                                              55/315.1
(Continued)

FOREIGN PATENT DOCUMENTS

CN          103456664 A       12/2013
JP          2000-091180 A     3/2000
(Continued)

*Primary Examiner* — Stephen M Gravini
(74) *Attorney, Agent, or Firm* — Harness, Dickey & Pierce, P.L.C.

(57) ABSTRACT

Disclosed is a substrate drying apparatus of substrate processing apparatus including a chamber that provides a space for processing a substrate, and a fluid supply unit that supplies a process fluid to the chamber, wherein the liquid supply unit includes a supply tank in which the fluid is stored, a supply line that connects the supply tank and the chamber, a branch line branched from a first point of the supply line and connected to a second point of the supply line, and a temperature control unit that adjusts the temperature of the fluid such that the temperatures of the fluids flowing through the supply line and the branch line between the first point and the second point are different.

16 Claims, 10 Drawing Sheets

(51) Int. Cl.
   *F26B 3/04* (2006.01)
   *F26B 21/10* (2006.01)
   *F26B 21/12* (2006.01)
   *H01L 21/67* (2006.01)
   *H01L 21/02* (2006.01)

(52) U.S. Cl.
   CPC ........ F26B 21/12 (2013.01); H01L 21/02101 (2013.01); H01L 21/6719 (2013.01); H01L 21/67034 (2013.01); H01L 21/67051 (2013.01); H01L 21/67109 (2013.01); H01L 21/67248 (2013.01); H01L 21/67253 (2013.01)

(58) Field of Classification Search
   USPC .................................. 34/352, 77, 78, 79, 80
   See application file for complete search history.

(56) References Cited

U.S. PATENT DOCUMENTS

| | | | | |
|---|---|---|---|---|
| 8,393,091 B2* | 3/2013 | Kawamoto | ....... | H01L 21/02057 134/21 |
| 8,701,308 B2* | 4/2014 | Hiroshiro | ............. | H05B 3/0052 118/723 E |
| 8,793,898 B2* | 8/2014 | Jeong | ................ | H01L 21/02057 134/32 |
| 8,826,558 B2* | 9/2014 | Priebe | ....................... | F26B 3/22 118/258 |
| 9,275,847 B2* | 3/2016 | Jung | ....................... | H01L 21/00 |
| 9,587,880 B2* | 3/2017 | Kim | ........................ | F26B 21/12 |
| 9,922,850 B2* | 3/2018 | Kwon | ................ | H01L 21/67051 |
| 2008/0029159 A1* | 2/2008 | Lee | .................... | H01L 21/67028 137/154 |
| 2011/0183503 A1 | 7/2011 | Kawamoto | | |
| 2011/0186545 A1* | 8/2011 | Mahadeswaraswamy | ................... | H01J 37/32935 216/59 |
| 2011/0289793 A1* | 12/2011 | Hayashi | .................... | F26B 3/04 34/357 |
| 2012/0048304 A1* | 3/2012 | Kitajima | ........... | H01L 21/02101 134/30 |
| 2016/0334162 A1* | 11/2016 | Kim | ....................... | F26B 21/145 |
| 2017/0092471 A1* | 3/2017 | Wakai | ............... | H01L 21/67109 |
| 2017/0173946 A1* | 6/2017 | Yamanaka | ............ | B41J 2/14274 |
| 2017/0250060 A1* | 8/2017 | Lubomirsky | ..... | H01J 37/32082 |
| 2018/0005857 A1* | 1/2018 | Zhang | ............... | H01J 37/32724 |

FOREIGN PATENT DOCUMENTS

| | | | | |
|---|---|---|---|---|
| JP | 3492528 B2 | | 2/2004 | |
| JP | 2008016669 A | | 1/2008 | |
| JP | 4870837 B2 | * | 11/2011 | |
| JP | 5626611 B2 | * | 11/2014 | ............. F26B 21/12 |
| KR | 2000-0023033 A | | 4/2000 | |
| KR | 10-0766342 B1 | | 10/2007 | |
| KR | 20120041710 A | | 5/2012 | |
| KR | 20140144806 A | | 12/2014 | |
| KR | 10-1513581 B1 | | 4/2015 | |
| KR | 10-1596064 B1 | | 2/2016 | |
| WO | WO 2008/143476 A1 | * | 11/2008 | |

* cited by examiner

METHOD AND APPARATUS FOR DRYING SUBSTRATE

CROSS-REFERENCE TO RELATED APPLICATIONS

A claim for priority under 35 U.S.C. § 119 is made to Korean Patent Application No. 10-2015-0067845 filed May 15, 2015, in the Korean Intellectual Property Office, the entire contents of which are hereby incorporated by reference.

BACKGROUND

The inventive concept relates to an apparatus and a method for drying a substrate, and more particularly, to an apparatus and a method for drying a substrate by using a supercritical fluid.

In general, a semiconductor device is formed through various processes, such as a photo process, an etching process, an ion implantation process, and a deposition process, on a substrate such as a silicon wafer. Further, in the processes, various foreign substances such as particles, organic contaminants, metal impurities are produced. Because the foreign substances cause defects and directly influence the performance and yield rate of the semiconductor device, the semiconductor manufacturing process is essentially accompanied by a cleaning process for removing the foreign substances.

The cleaning process includes a chemical processing process of removing contaminants from a substrate with a chemical, a wet cleaning process of removing the chemical residing on the substrate with pure water, and a drying process for drying the pure water residing on a surface of the substrate by supplying a drying fluid.

In the part, the drying process was performed by supplying heated nitrogen gas onto a substrate on which pure water is left. However, as the line width of a pattern formed on the substrate becomes smaller and the aspect ratio of the pattern becomes larger, pure water between patterns is not well removed. To achieve this, in recent years, pure water has been substituted on a substrate by a liquefied organic solvent, such as isopropyl alcohol, which is volatile and has a low surface tension as compared with pure water, and then a substrate has been dried by supplying heated nitrogen gas. However, because the organic solvent that is nonpolar and pure water that is polar are not easily mixed, a large amount of organic solvent should be supplied for a long time to substitute pure water with the liquefied organic solvent.

The conventional drying process has been performed in a method of substituting pure water on a substrate with an organic solvent, such as isopropyl alcohol, which has a relatively low surface tension.

However, because the drying method still causes a pattern collapse for a semiconductor having a fine circuit pattern having a line width of 30 nm or less even when an organic solvent is used, a supercritical drying process that overcomes the problems has recently replaced the existing drying processes.

When a substrate is dried by using a process fluid, the process fluid maintains a proper temperature when it is stored in a supply tank, but the temperature of the process fluid is lowered due to an adiabatic expansion. Accordingly, because the density of the process fluid increases and the surface tension thereof also increase, the process fluid influences the pattern on the substrate. Further, because the solubility for isopropyl alcohol becomes lower, the effect of removing isopropyl alcohol deteriorates.

SUMMARY

The inventive concept provides an apparatus and a method for drying a substrate which prevents descending of temperature in a process of supplying a process fluid, thereby improving the substrate processing efficiency.

The inventive concept provides an apparatus and a method for drying a substrate which prevent a substrate from being damaged in a process of supplying a process fluid.

The inventive concept provides a substrate drying apparatus.

According to an embodiment, there is provided a substrate drying apparatus including a chamber configured to provide a space for processing a substrate, and a fluid supply unit configured to supply a process fluid to the chamber, wherein the liquid supply unit includes a supply tank in which the fluid is stored, a supply line configured to connect the supply tank and the chamber, a branch line branched from a first point of the supply line and connected to a second point of the supply line, and a temperature control unit configured to adjust the temperature of the fluid such that the temperatures of the fluids flowing through the supply line and the branch line between the first point and the second point are different.

According to an embodiment, the temperature control unit may include a heater, and the heater may be installed only in the supply line of the supply line and the branch line.

According to an embodiment, the temperature control unit may include a first heater installed in the supply line and a second heater installed in the branch line.

According to an embodiment, the heating temperatures of the first heater and the second heater may be set to be different.

According to an embodiment, the branch line may include a plurality of heating lines connected in parallel to each other, the temperature control unit may be installed in each of the supply line and the plurality of heating lines, and the heating temperatures of the supply line and the plurality of heating lines may be different.

According to an embodiment, the branch line may further include a non-heating line connected in parallel to the heating lines, and the temperature control unit may be installed only in the supply line and the heating lines, of the supply line, the heating lines, and the non-heating line.

According to an embodiment, an opening/closing valve may be installed in each of the supply line and the branch line between the first point and the second point.

According to an embodiment, the chamber may be a high pressure chamber that performs a process by using a process fluid.

According to an embodiment, the process fluid may be carbon dioxide.

According to an embodiment, the substrate drying apparatus may further include a controller that controls the fluid supply unit and process of processing a substrate in the chamber, and the controller may perform a control such that a supply step of supplying the fluid into the chamber, and an exhaust step of exhausting the fluid are repeated n times (n is a natural number equal to or greater than 2), and controls the temperature control unit such that the temperature of the fluid supplied into the chamber in the m-th supply step is lower than the temperature of the fluid supplied into the chamber in the (m−1)-th supply step (m is a natural number of $2 \leq m \leq n$).

According to an embodiment, the substrate drying apparatus may include a chamber configured to provide a space for processing a substrate; and a controller that controls a process of processing the substrate in the chamber, and the controller may perform a control such that a supply step of supplying the fluid into the chamber, and an exhaust step of exhausting the fluid are repeated n times (n is a natural number equal to or greater than 2), and controls the temperature control unit such that the temperature of the fluid supplied into the chamber in the m-th supply step is lower than the temperature of the fluid supplied into the chamber in the (m−1)-th supply step (m is a natural number of 2≤m≤n).

According to an embodiment, the substrate drying apparatus may further include a fluid supply unit that supplies the process fluid into the chamber, and the fluid supply unit may include a supply tank in which the fluid is stored, and a supply line that connects the supply tank and the chamber, a heater that heats the fluid being installed in the supply line.

The inventive concept provides a substrate drying method.

According to an embodiment, there is provided a substrate drying method of removing a residual liquid residing on a substrate in a chamber by using a supercritical fluid, wherein a supply step of supplying the supercritical fluid into the chamber, and an exhaust step of exhausting the supercritical fluid, in which the residual liquid is dissolved, from the chamber are sequentially performed, and wherein the supply step and the exhaust step are repeated n times (n is a natural number equal to or greater than 2), and the temperature of the fluid supplied into the chamber in the m-th supply step is lower than the temperature of the supercritical fluid supplied into the chamber in the (m−1)-th supply step (m is a natural number of 2≤m≤n).

According to an embodiment, the pressure of the chamber at a time point when the exhaust is stopped in the m-th exhaust step may be lower than the pressure of the chamber at a time point when the exhaust is stopped in the (m−1)-th exhaust step.

According to an embodiment, the residual liquid may be isopropyl alcohol, and the supercritical fluid may be carbon dioxide.

According to an embodiment, there is provided a substrate drying method using the substrate drying apparatus of claim 1, wherein a supply step of supplying the fluid into the chamber and an exhaust step of exhausting the fluid from the chamber are repeated n times to process the substrate (n is a natural number equal to or greater than 2), and the temperature of the fluid flowing through the supply line between the first point and the second point is higher than the temperature of the fluid flowing through the branch line.

According to an embodiment, the branch line may further include a plurality of heating lines connected in parallel to each other and a non-heating line, and the temperatures of the fluids flowing through the heating lines may be higher than the temperature of the fluid flowing through the non-heating line.

According to an embodiment, the temperature of the fluid supplied into the chamber in the m-th supply step may be lower than the temperature of the fluid supplied into the chamber in the (m−1)-th supply step (m is a natural number of 2≤m≤n).

According to an embodiment, the fluid may be carbon dioxide in a supercritical state.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, a substrate processing apparatus 100 (see FIG. 2) according to the inventive concept will be described.

The substrate processing apparatus 100 may perform a supercritical process of processing a substrate S by using a supercritical fluid as a process fluid.

Here, the substrate S is an inclusive concept including a semiconductor device or a flat panel display (FPD), and other substrates used for manufacturing objects in which a circuit pattern is formed on a thin film. Examples of such substrates S include various wafers including a silicon wafer, glass substrates, and organic substrates.

A supercritical fluid refers to a phase having properties of both a gas and a liquid that is obtained if a fluid reaches a supercritical state in which a supercritical temperature and a supercritical pressure are exceeded. The molecular density of the supercritical fluid is close to that of a liquid and the viscosity of the supercritical fluid is close to that of a gas, and accordingly, the supercritical fluid has an excellent diffusion force, an excellent penetration force, and an excellent dissolving force, which are advantageous in chemical reactions, and has a very low surface tension so that an interfacial tension is not applied to a fine structure.

A supercritical process is performed by using the characteristics of the supercritical fluid, and representative examples of such a supercritical process include a supercritical drying process and a supercritical etching process. Hereinafter, a supercritical drying process as a supercritical process will be described. However, because the description of the supercritical drying process is merely for convenience of description, the substrate processing apparatus 100 may perform a supercritical process other than the supercritical drying process.

The supercritical drying process may be performed by drying a substrate S by dissolving an organic solvent residing in a circuit pattern of the substrate S with a supercritical fluid, and has an excellent drying efficiency and prevents a collapse. The supercritical fluid used for the supercritical drying process may be a material that is miscible with an organic solvent. For example, a supercritical carbon dioxide (scCO2) may be used as a supercritical fluid.

Figure 1:
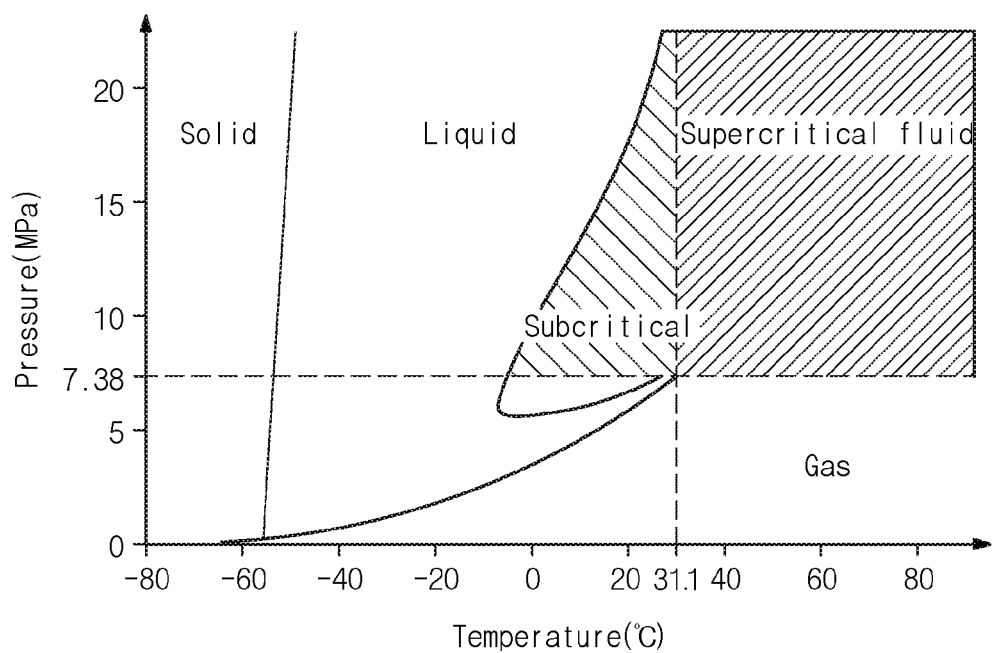
FIG. 1 is a graph depicting a phase change of carbon dioxide.

FIG. 1 is a graph depicting a phase change of carbon dioxide.

Carbon dioxide has a critical temperature of 31.1° C. and a critical pressure of 7.38 MPa, which are relatively low, so that it is easily converted into a supercritical state, a phase change of carbon dioxide is easily controlled by adjusting temperature and pressure, and the price of carbon dioxide is low. Further, carbon dioxide is nontoxic and is not harmful to the human bodies, and has inflammable and inactive characteristics, the supercritical carbon dioxide has a diffusion coefficient that is 10 to 100 times as high as those of water or other organic solvents so that the supercritical carbon penetrates fast and the organic solvent is rapidly substituted and has a very low surface tension so that it has properties that are advantageously used for drying a substrate S having a fine circuit pattern. In addition, carbon dioxide may recycle side-products of various chemical reactions, and may be used in a supercritical drying process and then may be converted into a gaseous state to be reused after separating an organic solvent therefrom, which reduces a burden in an aspect of environmental contaminations.

Hereinafter, an embodiment of the substrate processing apparatus 100 will be described. The substrate processing apparatus 100 may perform a cleaning process including the supercritical drying process according to the inventive concept.

Figure 2:
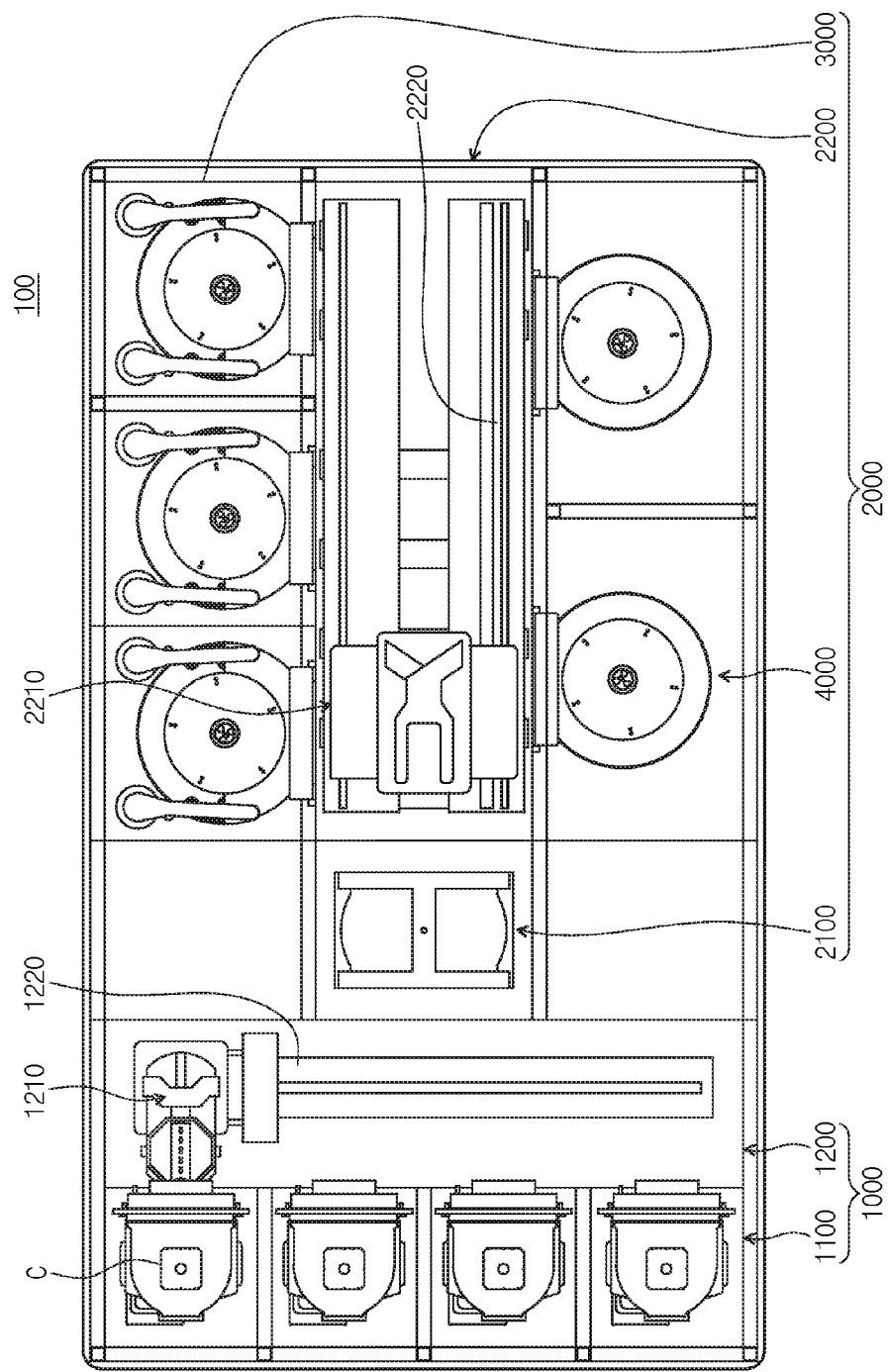
FIG. 2 is a plan view of an embodiment of a substrate processing apparatus.

FIG. 2 is a plan view of an embodiment of a substrate processing apparatus.

Referring to FIG. 2, the substrate processing apparatus 100 includes an index module 1000 and a process module 2000.

The index module 1000 may receive the substrate S from the outside and transports the substrate S to the process module 2000, and the process module 2000 may perform a supercritical drying process.

The index module 1000 is an equipment front end module (EFEM), and includes a load port 1100 and a feeding frame 1200.

A container C in which the substrate S is accommodated is positioned on the load port 1100. A front opening unified pod (FOUP) may be used as the container C. The container C may be carried into the load port 1100 from the outside by an overhead transfer, or may be carried out of the load port 1100.

The feeding frame 1200 transports the substrate S between the container C positioned on the load port 1100 and the process module 2000. The feeding frame 1200 includes an index robot 1210 and an index rail 1220. The index robot 1210 may transport the substrate S while moving on the index rail 1220.

The process module 2000 is a module for actually performing a process, and includes a buffer chamber 2100, a feeding chamber 2200, a first process chamber 3000, and a second process chamber 4000.

The buffer chamber 2100 provides a space in which the substrate S transported between the index module 1000 and the process module 200 temporarily stays. A buffer slot, in which the substrate S is positioned, may be provided in the buffer chamber 2100.

The feeding chamber 2200 transports the substrate S between the buffer chamber 2100 disposed at a circumference of the feeding chamber 2200, the first process chamber 3000, and the second process chamber 4000. The feeding chamber 2200 may include a feeding robot 2210 and a feeding rail 2220. The feeding robot 2210 may transport the substrate S while moving on the feeding rail 2220.

The first process chamber 3000 and the second process chamber 4000 may perform a cleaning process. Then, the cleaning process may be sequentially performed by the first process chamber 3000 and the second process chamber 4000. For example, the first process chamber 3000 may perform, among the cleaning process, a chemical process, a rinsing process, and an organic solvent process, and subsequently, the second process chamber 4000 may perform a supercritical drying process.

The first process chamber 3000 and the second process chamber 4000 are disposed on side surfaces of the feeding chamber 2200.

For example, the first process chamber 3000 and the second process chamber 4000 are disposed on different side surface of the feeding chamber 2200 to be opposite to each other.

Further, the process module 2000 may include a plurality of first process chambers 3000 and a plurality of second process chambers 4000.

The plurality of process chambers 3000 and 4000 may be disposed in a row on a side surface of the feeding chamber 2200, may be disposed to be stacked on one another, or may be disposed through a combination thereof.

Of course, the disposition of the first process chamber 3000 and the second process chamber 4000 is not limited to the aforementioned example, and may be properly changed in consideration of various elements such as a footprint or a process efficiency of the substrate processing apparatus 100.

Hereinafter, the first process chamber 3000 will be described.

Figure 3:
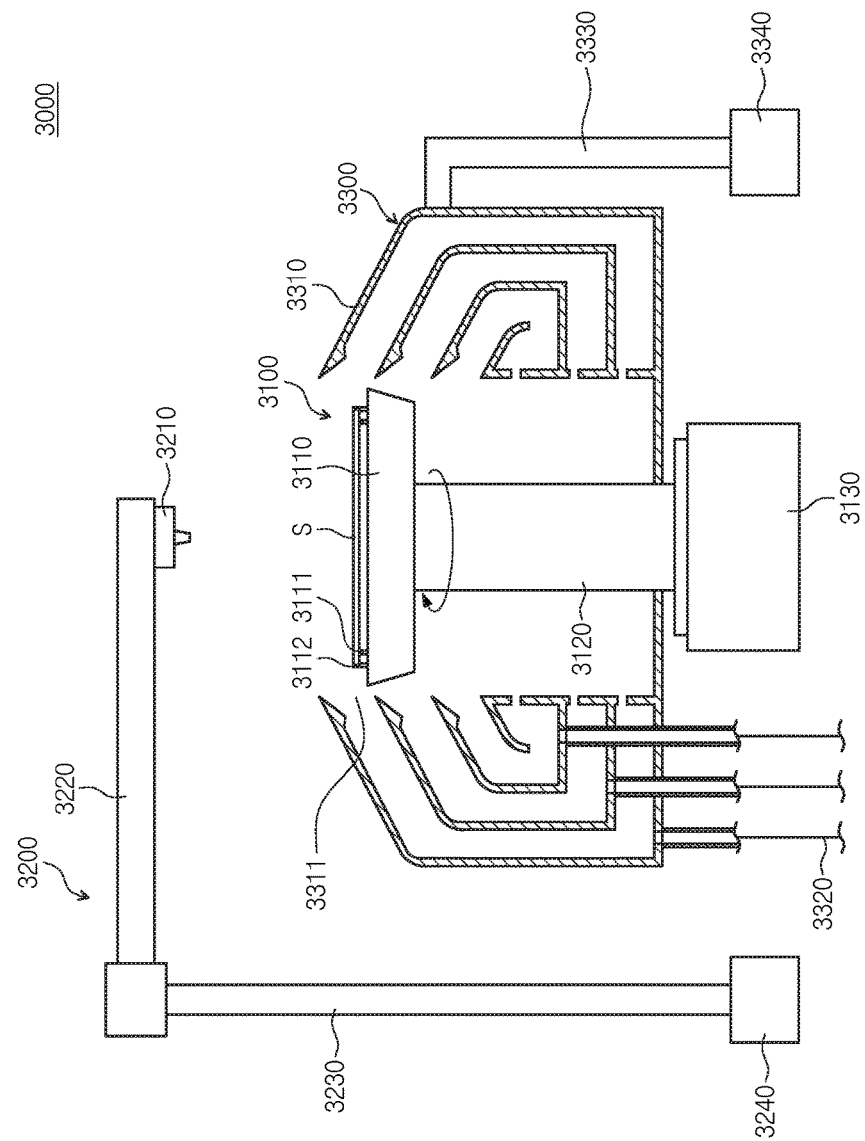
FIG. 3 is a sectional view of a first process chamber of FIG. 2.

FIG. 3 is a sectional view of a first process chamber of FIG. 2.

The first process chamber 3000 may perform a chemical process, a rinsing process, and an organic solvent process. Of course, the first process chamber 3000 may selectively perform some of the processes. Here, the chemical process is a process of removing foreign substances on the substrate S by providing a cleaning agent to the substrate S, the rinsing process is a process of washing the cleaning agent residing on the substrate S by providing a rinsing agent to the substrate S, and the organic solvent process is a process of substituting the rinsing agent residing between circuit patterns of the substrate S with an organic solvent having a low surface tension by providing an organic solvent to the substrate S.

Referring to FIG. 3, the first process chamber 3000 includes a support member 3100, a nozzle member 3200, and a recovery member 3300.

The support member 3100 may support the substrate S, and may rotate the supported substrate S. The support member 3100 may include a support plate 3110, a support pin 3111, a chucking pin 3112, a rotary shaft 3120, and a rotation driver 3130.

The support plate 3110 has an upper surface that is the same as or similar to the substrate S, and the support pin 3111 and the chucking pin 3112 are formed on the upper surface of the support plate 3110. The support pin 3111 may support the substrate S, and the chucking pin 3112 may fix the supported substrate S.

The rotary shaft 3120 is connected to a lower portion of the support plate 3110. The rotary shaft 3120 receives a rotational force from the rotation driver 3130 and rotates the support plate 3110. Accordingly, the substrate S seated on the support plate 3110 may be rotated. Accordingly, the chucking pin 3112 may prevent the substrate S from deviating from a proper position.

The nozzle member 3200 ejects a chemical to the substrate S. The nozzle member 3200 includes a nozzle 3210, a nozzle bar 3220, a nozzle shaft 3230, and a nozzle shaft driver 3240.

The nozzle 3210 ejects a chemical to the substrate S seated on the support plate 3110. The chemical may be a cleaning agent, a rinsing agent, and an organic solvent. Here, the cleaning agent may include a hydrogen peroxide solution, a solution in which ammonia (NH4OH), hydrochloric acid (HCl), or sulfuric acid (H2SO4) is mixed with a hydrogen peroxide acid solution, or a hydrofluoric acid (HF) solution. Further, pure water may be used as the rinsing agent. A solution or a gas of ethyl glycol, 1-propanol, tetra hydraulic franc, 4-hydroxyl, 4-methyl, 2-pentanone, 1-butanol, 2-butanol, methanol, ethanol, n-propyl alcohol, or dimethyl ether, including isopropyl alcohol, may be used as the organic solvent.

The nozzle 3210 is formed on the bottom surface of one end of the nozzle bar 3220. The nozzle bar 3220 is coupled to the nozzle shaft 3230, and the nozzle shaft 3230 is provided to be elevated or rotated. The nozzle shaft driver 3240 may adjust the location of the nozzle 3210 by elevating or rotating the nozzle shaft 3230.

The recovery member 3300 recovers the chemical supplied to the substrate S. If the chemical is supplied to the substrate S by the nozzle member 3200, the support member 3100 may uniformly supply the chemical to the entire area of the substrate S by rotating the substrate S. If the substrate S is rotated, the chemical is spattered from the substrate S, and the spattered chemical may be recovered by the recovery member 3300.

The recovery member 3300 may include a recovery vessel 3310, a recovery line 3320, an elevation bar 3330, and an elevation driver 3340.

The recovery vessel 3310 is provided to have an annular ring shape that surrounds the support plate 3110. A plurality of recovery vessels 3310 may be provided, and the plurality of recovery vessels 3310 are provided to have ring shapes that become sequentially more distant from the support plate 3110 when viewed from the top, and the heights of the recovery vessels 3310 become larger as the recovery vessels 3310 become more distant from the support plate 3110. Accordingly, a recovery hole 3311 through which the chemical spattered from the substrate S is formed in a space between the recovery vessels 3310.

A recovery line 3320 is formed on the lower surface of the recovery vessel 3310. The recovery line 3320 supplies the chemical to a chemical recycling system (not illustrated) that recycles a chemical recovered by the recovery vessel 3310.

The elevation bar 3330 is connected to the recovery vessel 3310, and receives power from the elevation driver 3340 and moves the recovery vessel 3310 upwards and downwards. When a plurality of recovery vessels 3310 are provided, the elevation bar 3330 may be connected to the outermost recovery vessel 3310. The elevation driver 3340 may select a recover hole 3311, through which the spattered chemical is spattered, from a plurality of recovery holes 3311 by elevating the recovery vessels 3310 through the elevation bar 3330.

Figure 4:
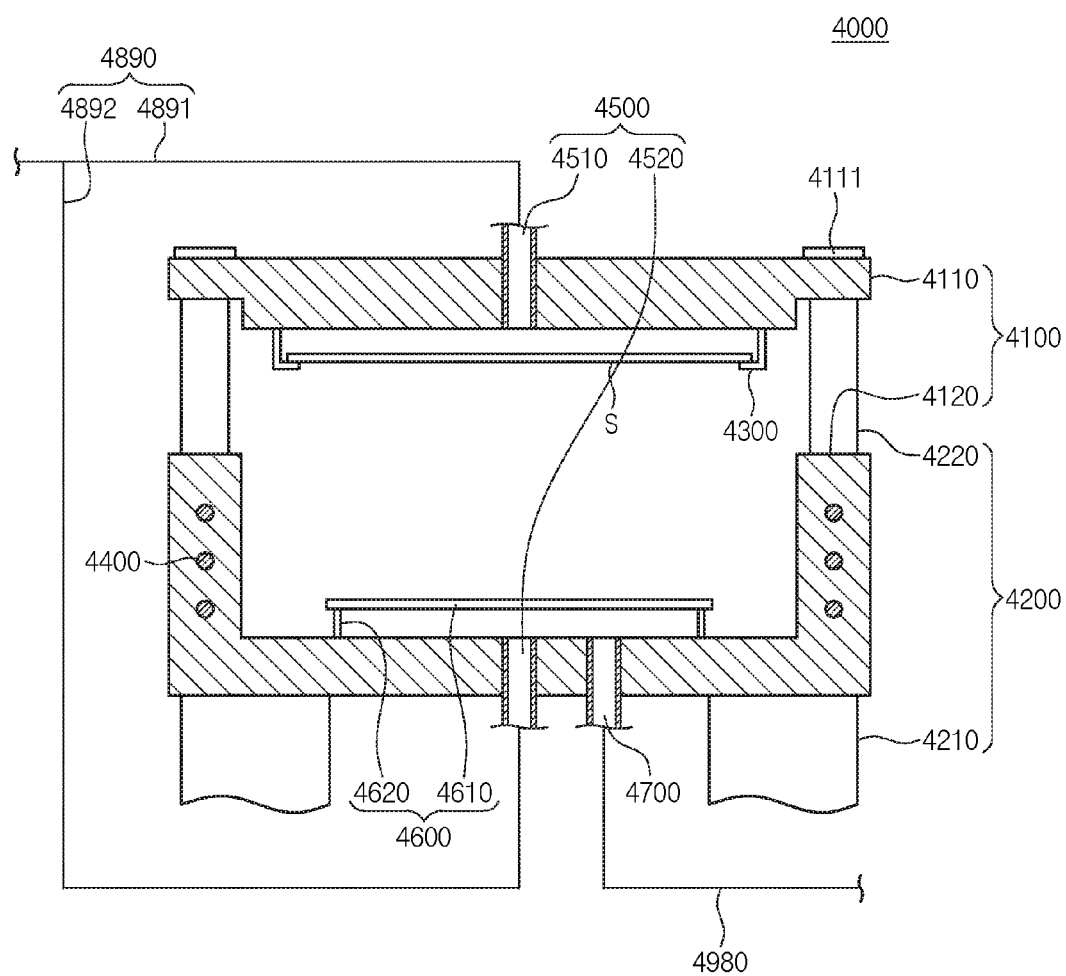
FIG. 4 is a sectional view of a second process chamber of FIG. 2.

FIG. 4 is a sectional view of an embodiment of the second process chamber of FIG. 2.

Referring to FIG. 4, the second process chamber 4000 may include a housing 4100, an elevation member 4200, a support member 4300, a heating member 4400, a supply port 4500, a blocking member 4600, and an exhaust port 4700.

The second process chamber 4000 may perform a supercritical drying process by using a supercritical fluid. The second process chamber 4000 may be a high pressure chamber. Of course, as described above, the process performed by the second process chamber 4000 may be a supercritical process other than the supercritical drying process.

The housing 4100 provides a space in which the supercritical drying process is performed. The housing 4100 is formed of a material that endures a high pressure of more than a critical pressure.

The housing 4100 has an upper housing 4110 and a lower housing 4120 disposed below the upper housing 4110.

The upper housing 4110 is fixedly installed in an external structure, and the lower housing 4120 may be elevated. If the lower housing 4120 is lowered to be spaced apart from the upper housing 4110, an interior space of the second process chamber 4000 is opened and the substrate S may be carried into the interior space of the second process chamber 4000 or may be carried out of the interior space of the second process chamber 4000. Here, the substrate S carried into the second process chamber 4000 may be converted into a state in which an organic solvent resides, via an organic solvent process in the first process chamber 3000. Further, if the lower housing 4120 is lifted to be attached to the upper housing 4110, the interior space of the second process chamber 4000 may be closed and a supercritical drying process may be performed in the interior of the second process chamber 4000.

The elevation member 4200 elevates the lower housing 4120. The elevation member 4200 may include an elevation cylinder 4210 and an elevation rod 4220. The elevation cylinder is coupled to the lower housing 4120 to generate a vertical driving force, that is, an elevational force. One end of the elevation rod 4220 is inserted into the elevation cylinder 4210 and extends vertically upwards, and an opposite end of the elevation rod 4220 is coupled to the upper housing 4110. If a driving force is generated in the elevation cylinder 4210 according to the construction, the elevation cylinder 4210 and the elevation rod 4220 may be relatively elevated, and the lower housing 4120 coupled to the elevation cylinder 4210 also may be elevated.

The support member 4300 supports the substrate S between the upper housing 4110 and the lower housing 4120. The support member 4300 may be installed on the lower surface of the upper housing 4110 to extend vertically downwards, and a lower end of the support member 4300 may be bent perpendicularly in a horizontal direction.

A horizontality adjusting member 4111 may be installed in the upper housing 4110 in which the support member 4300 is installed. The horizontality adjusting member 4111 adjusts the horizontality of the upper housing 4110. If the horizontality of the upper housing 4110 is adjusted, the horizontality of the substrate S seated on the support member 4300 installed in the upper housing 4111 may be adjusted. If the substrate S is inclined in the supercritical drying process, the organic solvent residing on the substrate S flows along the inclined surface so that a specific part of the substrate S may not be dried or the substrate S may be excessively dried to be damaged. The horizontality adjusting member 4111 may adjust the horizontality of the substrate S, thereby preventing the problem.

The heating member 4400 heats the interior of the second process chamber 4000. The heating member 4400 heats the supercritical fluid supplied into the second process chamber 4000 to a critical temperature or higher to maintain the supercritical fluid in a supercritical fluid phase or convert the liquefied supercritical fluid into a supercritical fluid again. The heating member 4400 may be buried and installed in at least one wall of the upper housing 4110 and the lower housing 4120. For example, the heating member 4400 may be a heater that receives electric power from the outside and generates heat.

The supply port 4500 supplies a supercritical fluid to the second process chamber 4000. The supply port 4500 may include an upper supply port 4510 and a lower supply port 4520. The upper supply port 4510 is formed in the upper housing 4110, and supplies a supercritical fluid onto the upper surface of the substrate S supported by the support member 4300. The lower supply port 4520 is formed in the lower housing 4120, and supplies a supercritical fluid onto the lower surface of the substrate S supported by the support member 4300.

As for the upper supply port 4510 and the lower supply port 4520, the lower supply port 4520 may supply a supercritical fluid first, and the upper supply port 4510 may supply the supercritical fluid later. Because the supercritical drying process may be initially performed while the internal pressure of the second process chamber 4000 does not reach a critical pressure, the supercritical fluid supplied into the second process chamber 400 may be liquefied. Accordingly, when a supercritical fluid is supplied to the upper supply port 4510 at an initial stage of the supercritical drying process, it may damage the substrate S while being liquefied and dropping onto the substrate S by the gravitational force. The upper supply port 4510 may start to supply a supercritical fluid if a supercritical fluid is supplied to the second process chamber 4000 through the lower supply port 4520 and the internal pressure of the second process chamber 4000 reaches a critical pressure, thereby preventing the supplied supercritical fluid from being liquefied and dropping onto the substrate S.

The blocking member 4600 blocks a supercritical fluid supplied through the supply port 4500 from being directly ejected onto the substrate S. The blocking member 4600 may include a blocking plate 4610 and a support 4620.

When the supercritical fluid is supplied through the lower supply port 4520 at an initial stage of the supercritical drying process, the internal pressure of the housing 4500 is low and thus the supplied supercritical fluid may be ejected at a high speed. If the supercritical fluid ejected at a high speed directly reaches the substrate S, a portion of the substrate S, to which the supercritical fluid is directly ejected, may be bent by a physical pressure of the supercritical fluid, generating a leaning phenomenon. Further, the substrate S is fluctuated by an ejection force of the supercritical fluid so that the organic solvent residing on the substrate S may flow, damaging a circuit pattern of the substrate S.

Accordingly, the blocking plate 4610 disposed between the lower supply port 4520 and the support member 4300 may block the supercritical fluid from being directly ejected onto the substrate S, thereby preventing the substrate S from being damaged by a physical force of the supercritical fluid.

Selectively, the blocking member 4600 may not be included in the second process chamber 4000.

The exhaust port 4700 exhausts the supercritical fluid from the second process chamber 4000.

The exhaust port 4700 may be formed in the lower housing 4120. At an late stage of the supercritical drying process, the supercritical fluid may be exhausted from the second process chamber 4000 so that the internal pressure of the second process chamber 4000 may be reduced to a critical pressure or low and the supercritical fluid may be liquefied. The liquefied supercritical fluid may be discharged by the gravitational force through the exhaust port 4700 formed in the lower housing 4120.

Figure 5:
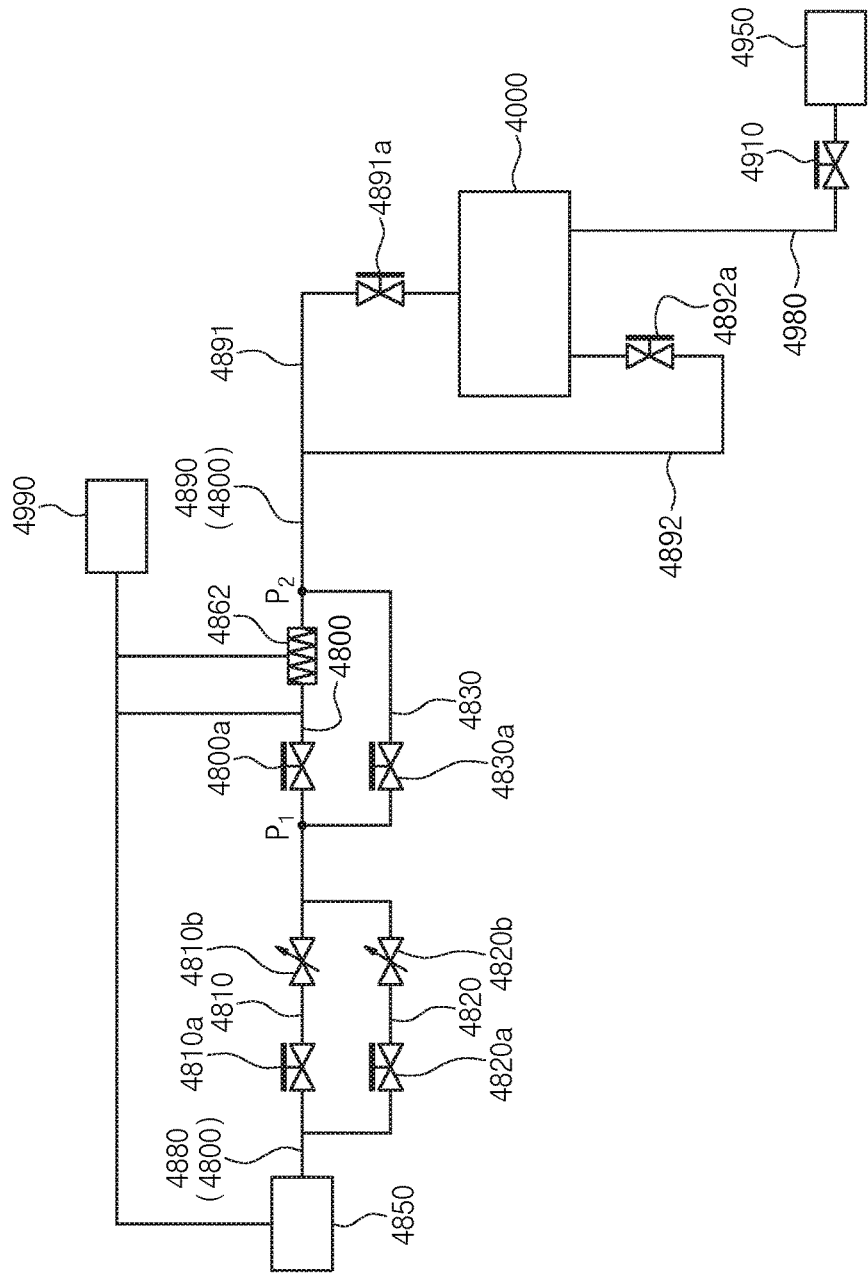
FIG. 5 is a view illustrating a substrate drying apparatus according to an embodiment of the inventive concept.

Hereinafter, the substrate drying apparatus 200, to and from which a process fluid is supplied and exhausted, will be described according to an embodiment of the inventive concept. FIG. 5 is a view of an embodiment of the substrate drying apparatus 200.

The substrate drying apparatus 200 includes a chamber 4000, a fluid supply unit 500, an exhaust line 4980, and a controller 4990. The chamber 4000 may have a configuration that is the same as or similar to the configuration of the second process chamber 4000.

The fluid supply unit 500 includes a supply tank 4850, a supply line 4800, a branch line 4830, and a temperature control unit 4860.

The supply tank 4850 stores a process fluid, which is to be supplied to the chamber 4000. The process fluid may be a fluid in a supercritical state. For example, the process fluid may be carbon dioxide in a state of a pressure of 100 to 200 bar and a temperature of 50 to 90° C.

The supply line 4800 supplies the process fluid from the supply tank 4850 to the chamber 4000. One end of the supply line 4800 is connected to the supply tank 4850 and an opposite end of the supply line 4800 is connected to the chamber 4000. The supply line 4800 includes a front supply line 4880 and a rear supply line 4890. The front supply line 4880 adjusts flow rate. The front supply line 4880 includes a first front supply line 4810 and a second front supply line 4820. The first front supply line 4810 and the second front supply line 4820 are connected in parallel to each other. The first front supply line 4810 includes a first opening/closing valve 4810a and a first flow rate valve 4810b. The first opening/closing valve 4810a controls flows of fluid in the first front supply line 4810. The first flow rate valve 4810b controls the flow rate of fluid in the first front supply line 4810. The first flow rate valve 4810b allows the process fluid to flow at a preset flow rate to adjust the pressure of the process fluid introduced into the interior of the chamber 4000. The second front supply line 4820 includes a second opening/closing valve 4820a and a second flow rate valve 4820b. The second opening/closing valve 4820a controls flows of fluid in the second front supply line 4820. The second flow rate valve 4820a controls the flow rate of fluid in the second front supply line 4820. The second flow rate valve 4820b allows the process fluid to flow at a preset flow rate to adjust the pressure of the process fluid introduced into the interior of the chamber 4000. The first flow rate valve 4810b and the second flow rate valve 4820b are set such that the flow rates of the process fluids flowing through the first front supply line 4810 and the second front supply line 4820 are different. According to an embodiment, the second supply flow rate is higher than the first supply flow rate.

The process fluid introduced into the chamber 4000 at an initial stage of the process of supplying the process fluid is provided through the first front supply line 4810. Because the flow rate of the process fluid flowing to the first front supply line 4810 is lower than that of the second front supply line 4820, an initial pressure of the process fluid in the interior of the chamber 4000 is set to be low. Accordingly, particles may be prevented from being generated in the interior of the chamber 4000. Further, a damage to the substrate S due to the initial pressure of the process fluid may be prevented. If the process fluid is supplied through the first supply line 4810 such that the interior of the chamber 4000 reaches a preset pressure, a large amount of process fluid is supplied through the second front supply line 4820. Accordingly, the efficiency of the process can be improved by shortening the process time.

The rear supply line 4890, 4891, and 4892 supplies the process fluid flowing through the first front supply line 4810 and the second front supply line 4820 at a different flow rates into the chamber 4000. The rear supply line 4890 includes a first rear supply line 4891 connected to an upper portion of the chamber 4000 and a second rear supply line 4892 connected to a lower portion of the chamber 4000. According to an example, when the substrate S is located on the upper side of the interior of the chamber 4000, the process fluid flowed from the first front supply line 4810 is provided to a lower portion of the chamber 4000 through the second rear supply line 4892. At an initial stage of the process of supplying the process fluid, the process fluid is supplied to a lower supply port 4520 that is distant from the substrate S to prevent a damage to the substrate S due to the initial pressure. Accordingly, if the process fluid is supplied through the second rear supply line 4892 to reach a preset pressure, a large amount of process fluid may be supplied through the first rear supply line 4891.

The branch line 4830 is provided between the front supply line 4880 and the rear supply line 4890. The branch line 4830 is branched from one side of the supply line 4800, and is connected to the supply line 4800 at an opposite side of the supply line 4800. A point at which the branch line 4830 is branched from the supply line 4800 will be referred to as a first point P1. A point at which the branch line 4830 branched from the first point P1 is connected to the supply line 4800 again will be referred to as a second point P2. The first point P1 and the second point P2 are located between the front supply line 4880 and the rear supply line 4890.

The branch line 4830 is connected in parallel to the supply line 4800. Opposite ends of the branch line 4830 are connected to the supply line 4800. One end of the branch line 4830 is connected to the first point P1 of the supply line 4800. An opposite end of the branch line 4830 is connected to the second point P2 of the supply line 4800.

Opening/closing valves 4800a and 4830a may be installed in the supply line 4800 and the branch line 4830 between the first point P1 and the second point P2. The opening/closing valves control the flows of the process fluid. The process fluid flowing from the first front supply line 4810 is controlled to flow to any one of the supply line 4800 and the branch line 4830. For example, the opening/closing valve 4830a of the branch line 4830 is closed when the process fluid flowing through the supply line 4800 is supplied to the chamber 4000. The opening/closing valve 4800a of the supply line 4800 is closed when the process fluid flowing through the branch line 4830 is supplied to the chamber 4000.

The temperature control unit 4860 performs a control such that the temperatures of the fluids flowing through the supply line 4800 and the branch line 4830 between the first point P1 and the second point P2 are different. The temperature control unit 4860 may be a heater 4862. For example, the heater 4862 may be installed only in the supply line 4800, of the supply line 4800 and the branch line 4830, and may not be installed in the branch line 4830. As described above, the process fluid is adiabatically expanded while flowing along the line, and the temperature of the process fluid is lowered to below the temperature of the process flow in the supply tank 4850. Accordingly, the process fluid flowing through the branch line 4830 in which the heater 4862 is not installed is lowered. Meanwhile, the temperature of the fluid flowing through the supply line 4800 in which the heater 4862 is installed may be maintained or raised. As the temperature of the process fluid (supercritical fluid) increases, the solubility for isopropyl alcohol increases. Accordingly, if the heater 4862 is installed to increase the temperature of the supercritical fluid, isopropyl alcohol residing on the substrate may be efficiently removed.

Further, the process time may be reduced by separately providing the branch line 4830. That is, because the process fluid of a temperature different from that of the supply line 4800 flows through the branch line 4830, the fluid of a temperature suitable for the process step may be supplied into the chamber 4000 without consuming a separate time for controlling the temperature.

The process fluid that processes the substrate in the chamber 4000 is exhausted through the exhaust line 4980. The exhausted process fluid flows to the supercritical fluid recycling unit 4950. An exhaust valve 4910 is provided in the exhaust line 4980. The exhaust step is performed by opening and closing the exhaust valve 4910.

The controller 4990 controls the processes of the fluid supply unit 500 and the chamber 4000. The controller 4990 performs a control such that one cycle including a supply step of supplying the process fluid from the supply line 4800 to the chamber 4000 and an exhaust step of exhausting the fluid from the chamber 4000 is repeated n times (n is a natural number equal to or greater than 2). Hereinafter, the processes will be described with reference to FIG. 6.

The supply step and the exhaust step may be repeated as process time elapses. Accordingly, if a large amount of isopropyl alcohol is dissolved in the supercritical fluid, it is exhausted, and a new supercritical fluid is supplied into the chamber 4000.

Figure 6:
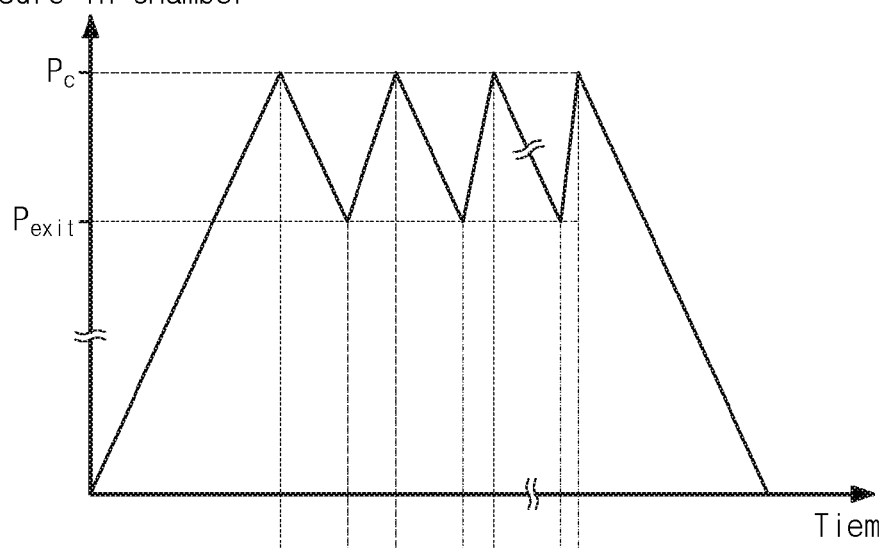
FIG. 6 is a graph depicting the internal pressure of a chamber and the temperature of a supplied supercritical fluid according to process progress time.
Figure 6:
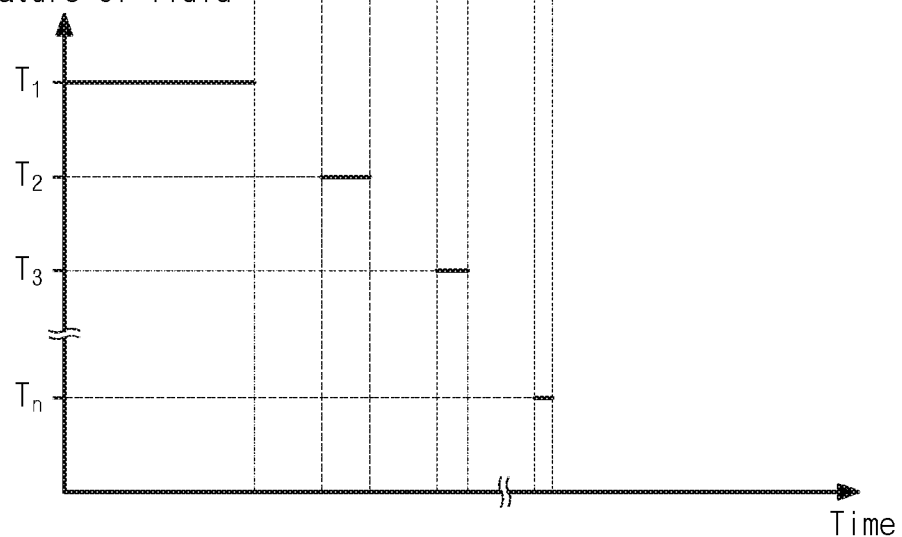

In the graph of FIG. 6 depicting the internal pressure of the chamber and the time, the ascending part indicates a process of supplying the supercritical fluid into the chamber and the descending part indicates a process of exhausting the supercritical fluid. First, the first supply step and the first exhaust step are performed, and later, the second supply step and the second exhaust step are performed. In this way, the drying effect of the substrate may be increased while the supply step and the exhaust step of the process fluid are repeatedly performed.

The controller 4990 may control the temperature control unit 4860 such that the process fluid of a high temperature is supplied into the chamber 4000 at an initial state of the process of supplying the process fluid and the process fluid of a relatively low temperature as compared with that of the initial stage is supplied as the supply step progresses. As described above, in the initial stage of the supply step, the substrate may be damaged due to the introduction of the process fluid. Accordingly, the damage of the substrate may be prevented by supplying a small amount of process fluid into the chamber 4000 per unit time.

The amount of supplied supercritical fluid may be adjusted through control of temperature. As the temperature of the supercritical fluid becomes lower, the density thereof becomes higher, and the temperature becomes higher, the density becomes lower because the distances between the molecules become more distant. That is, as the temperature of the supercritical fluid becomes lower, the mass of the supercritical fluid per unit volumetric flow rate becomes larger, and as the temperature becomes higher, the mass of the supercritical fluid per unit volume becomes smaller. Accordingly, if the temperatures of the supercritical fluid are different, the amounts of the supercritical fluid supplied into the chamber 4000 per unit time are different.

At the initial state of the supply step for the process fluid, the supercritical fluid of a high temperature is supplied. In this case, when the supercritical fluid is supplied into the chamber 4000 through the rear supply line 4890, the amount of the supercritical fluid supplied into the chamber 4000 per unit time is relatively small. Accordingly, the pressure of the chamber 4000 may prevent the damage to the substrate due to the introduction of the supercritical fluid. Referring to the graph of FIG. 6, it can be seen that because the amount of supercritical fluid supplied per unit time at the initial state of the supply step is small, the internal pressure of the chamber 4000 increases slowly.

Thereafter, as the process progresses, the supercritical fluid of a lower temperature is gradually supplied. In this case, when the supercritical fluid is supplied into the chamber 4000 through the rear supply line 4890, the amount of the supercritical fluid supplied into the chamber 4000 per unit time is relatively large. Accordingly, the process time may be shortened and the efficiency of the process may be improved. Referring to the graph of FIG. 6, it can be seen that because the amount of supercritical fluid supplied per unit time becomes larger as the process time elapses, the internal pressure of the chamber 4000 increases relatively fast.

To achieve this, the controller 4990 may control the temperature control unit 4860 such that that the temperature of the fluid supplied into the chamber in the m-th supply step is lower than the temperature of the fluid supplied into the chamber in the (m−1)-th supply step (m is a natural number of 2≤m≤n).

Referring to the graph of FIG. 6 regarding the temperature of the fluid and time, the supercritical fluid of a high temperature of T1 is supplied at the initial stage of the supply step of the fluid, and the temperature of the supplied fluid is gradually lowered to T2, T3, . . . , and Tn as the process time elapses.

Meanwhile, the amount of process fluid supplied per unit time may be increased through control of the temperature of the process fluid until the internal pressure of the chamber 4000 reaches a preset pressure. The preset pressure may be a critical pressure of the fluid.

By controlling the process, the drying process time may be shortened and the efficiency of the process may be improved while preventing the damage to the substrate. Further, as described above, the damage to the substrate may be further prevented and the efficiency of the process may be further improved by adjusting the flow rate of the process fluid flowing through the first front supply line and the second front supply line.

Unlike the aforementioned example, a plurality of branch lines 4830 may be provided instead of one branch line 4830, and the heater 4862 may be installed in the branch line 4830 or may not be installed in the branch line 4830.

Hereinafter, a modified example of the inventive concept will be described with reference to FIGS. 7 to 9.

Figure 7:
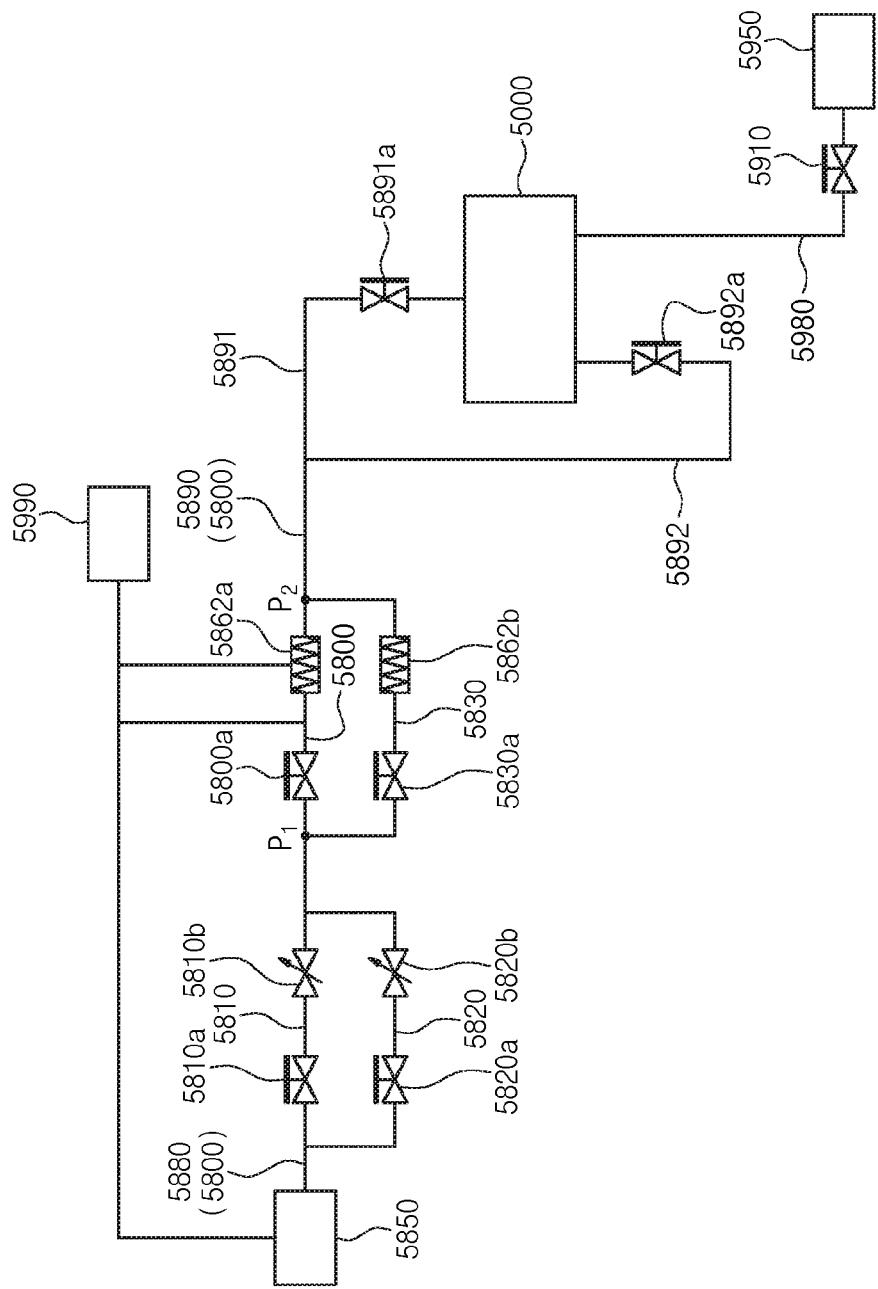
FIGS. 7 to 9 are views illustrating modified examples of the substrate drying apparatus of FIG. 5.

FIG. 7 is a view illustrating a substrate processing apparatus according to a first modified example of the inventive concept.

The temperature control unit 5860 may be installed in each of the supply line 5800 and the branch line 5830. The temperature control unit 5860 may be a heater 5862. A first heater 5862a may be installed in the supply line 5800, and a second heater 5862b may be installed in the branch line 5830. The set temperatures of the first heater 5862a and the second heater 5862b may be different. Accordingly, the temperatures of the supercritical fluid flowing through the supply line 5800 and the supercritical fluid flowing through the branch line 5800 may be different. For example, the supercritical fluid of 80 to 90° c flowing through the supply line 5800 in the first supply step may be supplied into the chamber 4000 in the first supply step, and the supercritical fluid of 70 to 80° C. flowing through the branch line 5830 may be supplied into the chamber 4000 in the second supply step.

Figure 8:
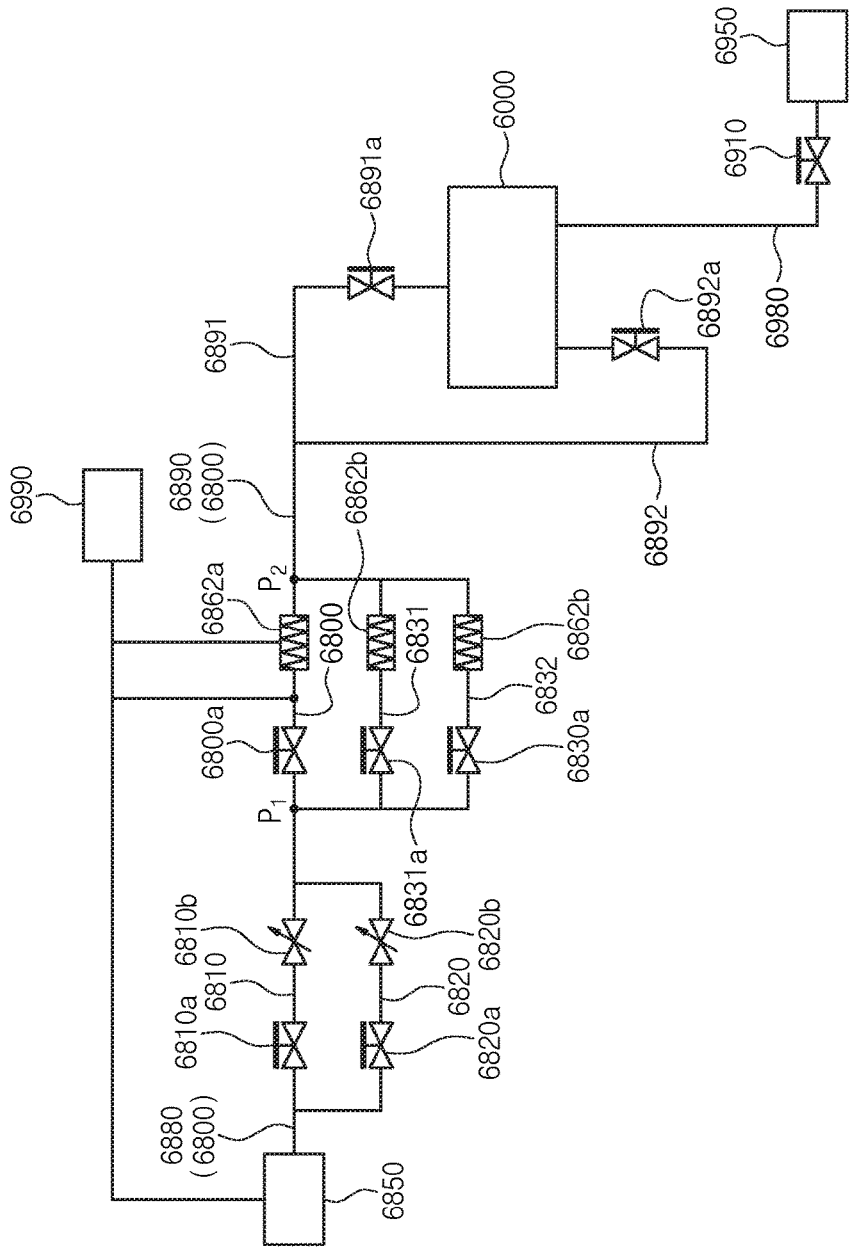

FIG. 8 is a view illustrating a substrate processing apparatus according to a second modified example of the inventive concept.

A plurality of branch lines 6830 may be formed to be connected in parallel to each other. For example, the branch lines 6830 may include a plurality of heating lines 6831 and 6832. The plurality of heating lines 6831 and 6832 may be not only connected in parallel to each other but also connected in parallel to the supply line 6800. Each of the heating lines 6831 and 6832 may have a temperature control unit 6860. The temperature control units 6860 may make the temperatures of the supercritical fluids flowing through the heating lines 6831 and 6832 different. Further, they may be different from the temperature of the supercritical fluid flowing through the supply line 6800. Accordingly, the temperatures of the supercritical fluids flowing through the supply line 6800 and the heating lines 6831 and 6832 may be different from each other. Opening/closing valves 6831a and 6832a may be installed in the heating lines 6831 and 6832 to control flows of the supercritical fluids in the heating lines 6831 and 6832, respectively. Accordingly, the fluids of higher temperatures, which flow through the supply line 6800 and the plurality of heating lines 6831 and 6832, may be sequentially supplied into the chamber 4000. For example, the supercritical fluid of 80 to 90° C. flowing through the supply line may be supplied into the chamber 4000 in the first supply step, the supercritical fluid of 70 to 80° C. flowing through the first heating line 6831 may be supplied into the chamber 4000 in the second supply step, and the supercritical fluid of 60 to 70° C. flowing through the second heating line 6832 may be supplied into the chamber 4000 in the third supply step.

Figure 9:
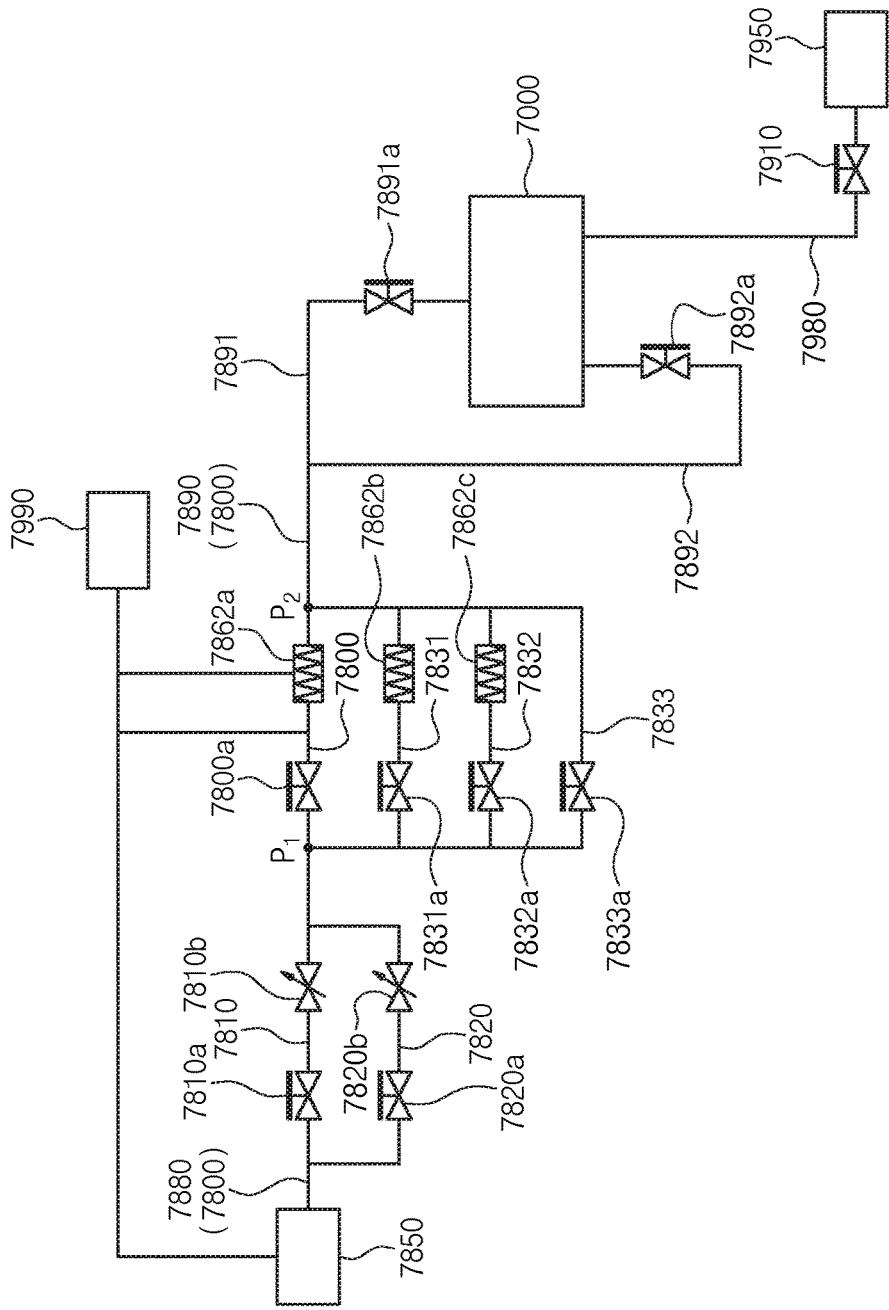

FIG. 9 is a view illustrating a substrate processing apparatus according to a third modified example of the inventive concept.

The branch line 7830 may further include a non-heating line 7833 connected in parallel, in addition to the heating lines 7831 and 7832. The temperature control units 7860 are installed only in the supply line 7800 and the heating lines 7831 and 7832, and a temperature control unit 7860 is not installed in the non-heating line 7833. Accordingly, only the temperatures of the supercritical fluids flowing through the supply line 7800 and the heating lines 7831 and 7832 may be increased. The supercritical fluid in the non-heating line 7833 is adiabatically expanded, and the temperature of the supercritical fluid is lowered. The supercritical fluids of higher temperatures, which flow through the supply line 7800 and the heating lines 7831 and 7832, are sequentially supplied into the chamber 4000, and the supercritical fluid in the non-heating line 7833 is supplied in the last supply step. Further, although not illustrated, only one heating line 7831 instead of a plurality of heating lines may be provided, and a non-heating line 7833 may be further provided.

In the aforementioned modified example, the temperatures of the supercritical fluids supplied into the chambers 5000, 6000, and 7000 may be variously set. The temperatures of the supercritical fluids may be classified more finely, according to the supply steps of the supercritical fluid. Accordingly, a damage to the substrate can be prevented and the efficiency of the process can be maximized.

Figure 10:
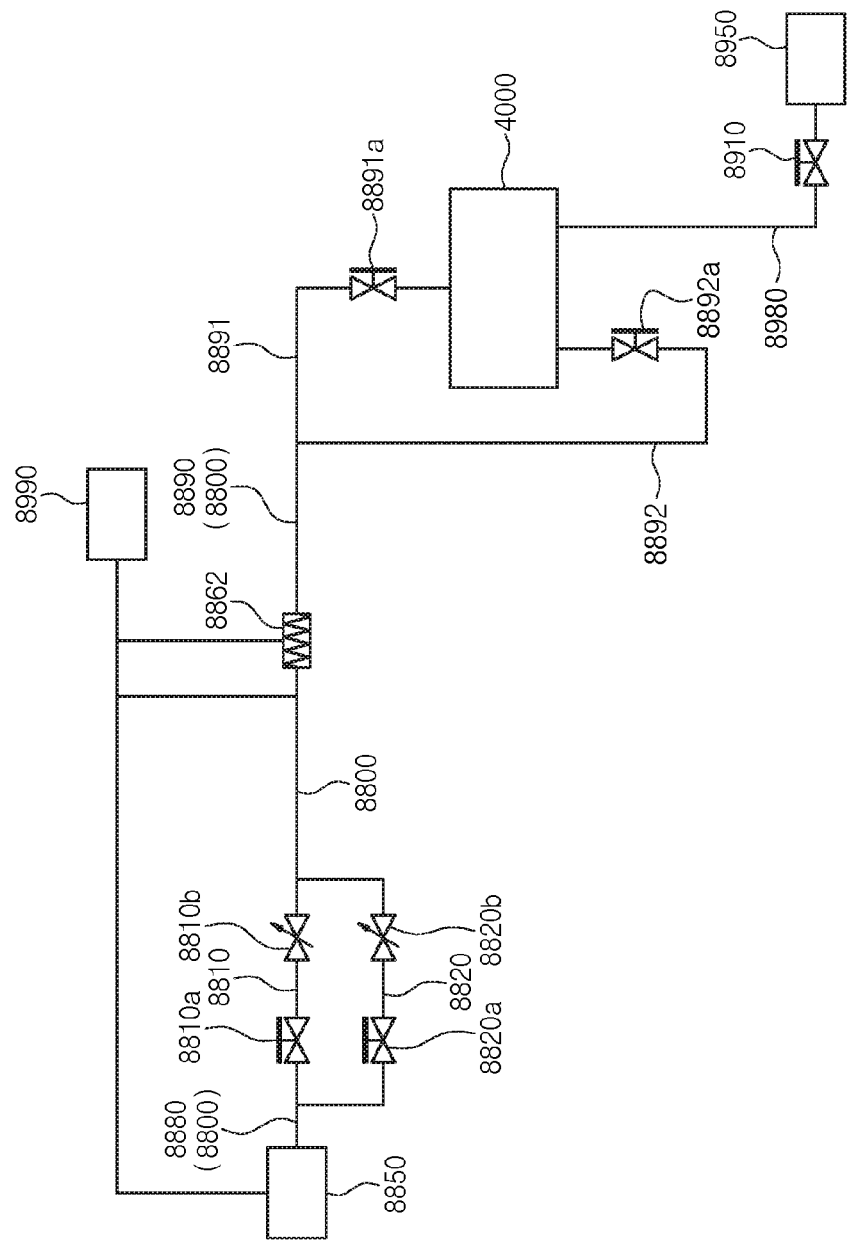
FIG. 10 is a view illustrating a substrate drying apparatus according to another embodiment of the inventive concept.

FIG. 10 illustrates a substrate drying apparatus 200 according to another embodiment of the inventive concept; unlike the aforementioned example, the branch line 8830 may be omitted. A temperature control unit 8860 is provided in a supply line 8800. An appropriate temperature may be maintained while the supercritical fluid flows along the supply line 8800. The appropriate temperature may be maintained even when the supercritical fluid is supplied into a chamber 8000.

Further, it has been described in all the aforementioned examples that the controllers 4990, 5990, 6990, 7990, and 8990 are provided, but a controller 4990, 5990, 6990, 7990, and 8990 may not be provided.

Hereinafter, a substrate drying method according to the inventive concept will be described by using the aforementioned substrate processing apparatus 100. The following description relates to a substrate drying method of removing a residual liquid such as isopropyl alcohol, which is left after a cleaning process, by using a supercritical fluid. Meanwhile, because the above description is only for convenience of description, the substrate drying method may be performed by the same or similar apparatus, in addition to the aforementioned substrate processing apparatus 100. Further, the substrate drying method according to the inventive concept may be stored in a computer readable recording medium in the form of a code or a program for performing the method.

The supply step of supplying the supercritical fluid into the chamber 4000 and the exhaust step of exhausting the supercritical fluid in which the residual liquid is dissolved are sequentially performed. Further, a supply step and an exhaust step are repeated n times (n is a natural number equal to or greater than 2), and it is controlled such that the temperature of the fluid supplied into the chamber 4000 in the m-th supply step is lower than the temperature of the fluid supplied into the chamber 4000 in the (m−1)-th supply step (m is a natural number of 2≤m≤n).

In the initial supply step, the supercritical fluid of a high temperature is supplied. As described above, because the density of the supercritical fluid becomes lower as the temperature of the supercritical fluid becomes higher, a small amount of supercritical fluid as per unit volumetric flow rate may be supplied. Accordingly, as described above, a damage to the substrate may be prevented.

As the supercritical fluid is introduced into the chamber 4000, the supercritical fluid of lower temperature is gradually sequentially supplied in the following supply steps. Because the density of the supercritical fluid becomes higher as the temperature of the supercritical fluid becomes lower, a large amount of supercritical fluid per unit volumetric flow rate may be supplied. Accordingly, as described above, the process time may be shortened and the efficiency of the process may be improved.

Further, the amount of supplied supercritical fluid may be adjusted by adjusting the flow rate of the supercritical fluids flowing through the first front supply line 4810 and the second front supply line 4820. Further, the supercritical fluid may be supplied at the same time through the upper and lower sides of the chamber 4000 to improve process time and process efficiency if the internal pressure of the chamber 4000 reaches a preset pressure. Through this, a damage to the substrate may be prevented, drying process time may be shortened, and the efficiency of the drying process may be improved.

The inventive concept may improve substrate processing efficiency by preventing descending of temperature in a process of supplying a process fluid.

The inventive concept also may prevent a substrate from being damaged in a process of supplying a process chamber.

The above-mentioned detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate drying apparatus comprising:
   a chamber configured to provide a space for processing a substrate;
   a fluid supply unit configured to supply a process fluid to the chamber; and
   a controller configured to control the fluid supply unit to the chamber,
   wherein the fluid supply unit includes:
   a supply tank in which the process fluid is stored;
   a supply line configured to connect the supply tank and the chamber;
   a branch line branched from a first point of the supply line and connected to a second point of the supply line; and
   a temperature control unit configured to adjust a temperature of the process fluid such that a temperature of the process fluid flowing through the supply line and a temperature of the process fluid flowing through the branch line between the first point and the second point are different,
   wherein the controller is configured to control the process fluid supplied into the chamber; and to control the process fluid exhausted from the chamber, the controller is configured to repeat the supplying and the exhausting n times (n is a natural number equal to or greater than 2), wherein a temperature of the process fluid supplied into the chamber in a m-th supply operation is lower than a temperature of the process fluid supplied into the chamber in a (m−1)-th supply operation (m is a natural number of 2≤m≤n).

2. The substrate drying apparatus of claim 1, wherein the temperature control unit comprises a heater, and the heater is installed only in the supply line of the supply line and the branch line.

3. The substrate drying apparatus of claim 1, wherein the temperature control unit comprises a first heater installed in the supply line and a second heater installed in the branch line.

4. The substrate drying apparatus of claim 3, wherein heating temperatures of the first heater and the second heater are set to be different.

5. The substrate drying apparatus of claim 1, wherein the branch line comprises a plurality of heating lines connected in parallel to each other, the temperature control unit is installed in each of the supply line and the plurality of heating lines, and heating temperatures of the supply line and the plurality of heating lines are different.

6. The substrate drying apparatus of claim 5, wherein the branch line further comprises a non-heating line connected in parallel to the heating lines, and the temperature control unit is installed only in the supply line and the heating lines of the supply line, the heating lines, and the non-heating line.

7. The substrate drying apparatus of claim 1, wherein an opening/closing valve is installed in each of the supply line and the branch line between the first point and the second point.

8. The substrate drying apparatus of claim 1, wherein the chamber is a high pressure chamber and the process fluid is a supercritical fluid.

9. The substrate drying apparatus of claim 8, wherein the process fluid is carbon dioxide.

10. A substrate drying apparatus comprising:
- a chamber configured to provide a space for processing a substrate; and
- a fluid supply unit configured to supply a process fluid to the chamber,
- wherein the fluid supply unit includes:
- a supply tank in which the process fluid is stored;
- a supply line configured to connect the supply tank and the chamber;
- a temperature control unit provided in the supply line configured to adjust a temperature of the fluid flowing through the supply line; and
- a controller configured to control the fluid supply unit and processes of processing a substrate in the chamber,
- wherein the controller is configured to control the process fluid supplied into the chamber; and to control the process fluid exhausted from the chamber, the controller is configured to repeat the supplying and the exhausting n times (n is a natural number equal to or greater than 2), wherein a temperature of the process fluid supplied into the chamber in a m-th supply operation is lower than a temperature of the process fluid supplied into the chamber in a (m−1)-th supply operation (m is a natural number of $2 \le m \le n$).

11. A substrate drying method of removing a residual liquid residing on a substrate in a chamber by using a supercritical fluid comprising:
- supplying the supercritical fluid into the chamber; and
- exhausting the supercritical fluid, in which the residual liquid is dissolved, from the chamber,
- wherein the supplying and the exhausting are repeated n times (n is a natural number equal to or greater than 2), and a temperature of the supercritical fluid supplied into the chamber in a m-th supply operation is lower than a temperature of the supercritical fluid supplied into the chamber in a (m−1)-th supply operation (m is a natural number of $2 \le m \le n$).

12. The substrate drying method of claim 11, wherein the residual liquid is isopropyl alcohol, and the supercritical fluid is carbon dioxide.

13. A substrate drying method using the substrate drying apparatus of claim 1 comprising;
- supplying the process fluid into the chamber; and
- exhausting the process fluid from the chamber,
- wherein the supplying and the exhausting are repeated n times to process the substrate (n is a natural number equal to or greater than 2), and a temperature of the process fluid flowing through the supply line between the first point and the second point is higher than a temperature of the process fluid flowing through the branch line.

14. The substrate drying method of claim 13, wherein the branch line further comprises a plurality of heating lines connected in parallel to each other and a non-heating line, and a temperature of the process fluid flowing through the plurality of heating lines is higher than a temperature of the process fluid flowing through the non-heating line.

15. The substrate drying method of claim 13, wherein a temperature of the process fluid supplied into the chamber in a m-th supply step is lower than a temperature of the process fluid supplied into the chamber in a (m−1)-th supply step (m is a natural number of $2 \le m \le n$).

16. The substrate drying method of claim 13, wherein the process fluid is carbon dioxide in a supercritical state.

* * * * *